(12) United States Patent
Memis et al.

(10) Patent No.: US 7,145,221 B2
(45) Date of Patent: Dec. 5, 2006

(54) LOW MOISTURE ABSORPTIVE CIRCUITIZED SUBSTRATE, METHOD OF MAKING SAME, ELECTRICAL ASSEMBLY UTILIZING SAME, AND INFORMATION HANDLING SYSTEM UTILIZING SAME

(75) Inventors: Irving Memis, Vestal, NY (US); Kostas I. Papathomas, Endicott, NY (US)

(73) Assignee: Endicott Interconnect Technologies, Inc., Endicott, NY (US)

( * ) Notice: Subject to any disclaimer, the term of this patent is extended or adjusted under 35 U.S.C. 154(b) by 135 days.

(21) Appl. No.: 10/920,235

(22) Filed: Aug. 18, 2004

(65) Prior Publication Data

US 2005/0224251 A1 Oct. 13, 2005

Related U.S. Application Data

(63) Continuation-in-part of application No. 10/812,890, filed on Mar. 31, 2004.

(51) Int. Cl.
 *H01L 23/58* (2006.01)
(52) U.S. Cl. ................ 257/642; 257/643; 257/E51.027
(58) Field of Classification Search ................ 257/642, 257/643
 See application file for complete search history.

(56) References Cited

U.S. PATENT DOCUMENTS

| | | | |
|---|---|---|---|
| 3,953,566 A | 4/1976 | Gore | |
| 3,962,653 A | 6/1976 | Basset | |
| 4,187,390 A | 2/1980 | Gore | |
| 4,482,516 A | 11/1984 | Bowman et al. | |
| 4,579,772 A | 4/1986 | Bhatt et al. | |
| 4,642,160 A | 2/1987 | Burgess | |
| 4,675,789 A | 6/1987 | Kuwabara et al. | |
| 4,713,137 A | 12/1987 | Sexton | |
| 4,783,345 A | 11/1988 | Kleeberg et al. | |
| 4,864,722 A | 9/1989 | Lazzarini et al. | |
| 5,129,142 A | 7/1992 | Bindra et al. | |
| 5,229,550 A | 7/1993 | Bindra et al. | |
| 5,246,817 A | 9/1993 | Shipley | |
| 5,368,921 A | 11/1994 | Ishii et al. | |
| 5,376,453 A | 12/1994 | von Gentzkow et al. | |
| 5,418,689 A | 5/1995 | Alpaugh et al. | |
| 5,483,101 A | 1/1996 | Shimoto et al. | |
| 5,565,267 A | 10/1996 | Capote et al. | |
| 5,648,171 A | 7/1997 | von Gentzkow et al. | |
| 5,652,055 A | 7/1997 | King et al. | |
| 5,670,262 A | 9/1997 | Dalman | |
| 5,677,045 A | 10/1997 | Nagai et al. | |
| 5,685,070 A | 11/1997 | Alpaugh et al. | |
| 5,726,863 A | 3/1998 | Nakayama et al. | |

(Continued)

FOREIGN PATENT DOCUMENTS

JP 56049271 5/1981

(Continued)

*Primary Examiner*—Ngân V. Ngô
(74) *Attorney, Agent, or Firm*—Hinman, Howard & Kattell, LLP; Lawrence R. Fraley

(57) ABSTRACT

A circuitized substrate comprising a first layer comprised of a dielectric material including a low moisture absorptive polymer resin in combination with a nodular fluoropolymer web encased within the resin, the resulting dielectric layer formed from this combination not including continuous or semi-continuous fibers as part thereof. The substrate further includes at least one circuitized layer positioned on the dielectric first layer. An electrical assembly and a method of making the substrate are also provided, as is an information handling system (e.g., computer) incorporating the circuitized substrate of the invention as part thereof.

34 Claims, 3 Drawing Sheets

U.S. PATENT DOCUMENTS

| | | | |
|---|---|---|---|
| 5,814,405 A * | 9/1998 | Branca et al. | 428/311.51 |
| 5,981,880 A | 11/1999 | Appelt et al. | |
| 6,018,196 A | 1/2000 | Noddin | |
| 6,042,685 A | 3/2000 | Shinada et al. | |
| 6,119,338 A | 9/2000 | Wang et al. | |
| 6,143,401 A | 11/2000 | Fischer | |
| 6,207,595 B1 | 3/2001 | Appelt et al. | |
| 6,212,769 B1 | 4/2001 | Boyko et al. | |
| 6,248,959 B1 | 6/2001 | Sylvester | |
| 6,291,779 B1 | 9/2001 | Lubert et al. | |
| 6,323,436 B1 | 11/2001 | Hedrick et al. | |
| 6,378,201 B1 | 4/2002 | Tsukada et al. | |
| 6,405,431 B1 | 6/2002 | Shin et al. | |
| 6,506,979 B1 | 1/2003 | Shelnut et al. | |
| 6,541,589 B1 | 4/2003 | Baillie | |
| 6,586,687 B1 | 7/2003 | Lee et al. | |
| 2002/0150673 A1 | 10/2002 | Thorn et al. | |
| 2002/0170827 A1 | 11/2002 | Furuya | |
| 2002/0172019 A1 | 11/2002 | Suzuki et al. | |
| 2002/0190378 A1 | 12/2002 | Hus et al. | |
| 2003/0022013 A1 | 1/2003 | Japp et al. | |

FOREIGN PATENT DOCUMENTS

| | | |
|---|---|---|
| JP | 7086710 | 3/1995 |
| JP | 7097466 | 4/1995 |
| JP | 8092394 | 4/1996 |
| JP | 2001015912 A2 | 1/2001 |
| JP | 2002223070 A2 | 8/2002 |

* cited by examiner

LOW MOISTURE ABSORPTIVE CIRCUITIZED SUBSTRATE, METHOD OF MAKING SAME, ELECTRICAL ASSEMBLY UTILIZING SAME, AND INFORMATION HANDLING SYSTEM UTILIZING SAME

CROSS REFERENCE TO CO-PENDING APPLICATION

The application is a continuation-in-part application of Ser. No. 10/812,890, entitled "CIRCUITIZED SUBSTRATE, METHOD OF MAKING SAME, ELECTRICAL ASSEMBLY UTILIZING SAME, AND INFORMATION HANDLING SYSTEM UTILIZING SAME", filed Mar. 31, 2004, (Inventors: R. Japp et al).

TECHNICAL FIELD

This invention relates to circuitized substrates and particularly to those used in multilayered circuit boards, chip carriers, and the like, and to processes for manufacturing same. More particularly, the invention relates to substrates used in such final products so as to provide same with increased circuit density.

BACKGROUND OF THE INVENTION

Multilayered printed circuit boards (PCBs), laminate chip carriers, and the like permit formation of multiple circuits in a minimum volume or space. These typically comprise a stack of layers of signal, ground and/or power planes (lines) separated from each other by a layer of dielectric material. The lines are often in electrical contact with each other by plated holes passing through the dielectric layers. The plated holes are often referred to as "vias" if internally located, "blind vias" if extending a predetermined depth within the board from an external surface, or "plated-thru-holes" (PTHs) if extending substantially through the board's full thickness. By the term "thru-hole" as used herein is meant to include all three types of such board openings.

Conventional methods for fabricating PCBs, chip carriers and the like typically comprise fabrication of separate innerlayer circuits (circuitized layers), which are formed by coating a photosensitive layer or film over a copper layer of a copper clad innerlayer base material. The photosensitive coating is imaged, developed and the exposed copper is etched to form conductor lines. After etching, the photosensitive film is stripped from the copper leaving the circuit pattern on the surface of the innerlayer base material. This processing is referred to as photolithographic processing in the PCB art and further description is not deemed necessary.

Following the formation of individual innerlayer circuits, a multilayer stack is formed by preparing a lay-up of innerlayers, ground planes, power planes, etc., typically separated from each other by a dielectric "prepreg", typically comprising a layer of glass (usually fiberglass) cloth impregnated with a partially cured material, typically a B-stage epoxy resin. The top and bottom outer layers of the stack usually comprise copper clad, glass-filled, epoxy planar substrates with the copper cladding comprising exterior surfaces of the stack. The stack is laminated to form a monolithic structure using heat and pressure to fully cure the B-stage resin. The stack so formed typically has metal (usually copper) cladding on both of its exterior surfaces. Exterior circuit layers are formed in the copper cladding using procedures similar to the procedures used to form the innerlayer circuits. A photosensitive film is applied to the copper cladding. The coating is exposed to patterned activating radiation and developed. An etchant is then used to remove copper bared by the development of the photosensitive film. Finally, the remaining photosensitive film is removed to provide the exterior circuit layers.

Electrically conductive thru-holes (or interconnects) are used to electrically connect individual circuit layers within the structure to each other and to the outer surfaces and typically pass through all or a portion of the stack. Thru-holes are generally formed prior to the formation of circuits on the exterior surfaces by drilling holes through the stack at appropriate locations. Following several pre-treatment steps, the walls of the holes are catalyzed by contact with a plating catalyst and metallized, typically by contact with an electroless or electrolytic copper plating solution to form conductive pathways between circuit layers. Following formation of the conductive thru-holes, exterior circuits, or outerlayers are formed using the procedure described above.

After construction, semiconductor chips and/or other electrical components are mounted at appropriate locations on the exterior circuit layers of the multilayered stack, typically using solder mount pads to bond the components to the PCB. These components are usually in electrical contact with the circuits within the structure through the conductive thru-holes, as desired. The solder pads are typically formed by coating an organic solder mask coating over the exterior circuit layers. The solder mask may be applied by screen coating a liquid solder mask coating material over the surface of the exterior circuit layers using a screen having openings defining areas where solder mount pads are to be formed. Alternatively, a photoimageable solder mask may be coated onto the board and exposed and developed to yield an array of openings defining the pads. The openings are then coated with solder using processes known to the art such as wave soldering.

Complexity of the resulting products as described herein has increased significantly over the past few years. For example, PCBs for mainframe computers may have as many as 36 layers of circuitry or more, with the complete stack having a thickness of about 0.250 inch (250 mils). These boards are typically designed with about three or five mil wide signal lines and twelve mil diameter thru-holes. For increased circuit densification in many of today's products such as PCBs, chip carriers and the like, the industry desires to reduce signal lines to a width of two mils or less and thru-hole diameters to two mils or less. Most known commercial procedures, especially those of the nature described herein, are incapable of economically forming the dimensions desired by the industry.

In addition to decreasing line width and via diameter, the industry also desires to avoid manufacturing problems frequently associated with PCBs, chip carriers and the like. As described above, current procedures utilize innerlayer materials that are glass-reinforced resin or other suitable dielectric material layers having a thickness of from about two to five mils clad with metal (typically copper) on both surfaces. Glass-reinforcing material, typically utilizing continuous strands of fiberglass which extend throughout the width and length of the overall final substrates used, is used to contribute strength and rigidity to the final stack. Being continuous, these strands run the full width (or length) of the structure and include no breaks or other segments as part thereof. Thus, by the term "continuous" as used herein to define fibrous materials is meant a structure such as a woven cloth of lengthy fibers, including fibers which, as stated, typically run the full distance through the structure. By the term "semi-continuous" as used herein (see below) to define fibrous materials is meant structures with much shortened length fibers, what can be referred to as "chopped" fibers such as chopped fiber mats. Such fibrous materials occupy a relatively significant portion of the substrate's total volume, a disadvantage especially when attempting to produce highly dense numbers of thru-holes and very fine line circuitry to meet new, more stringent design requirements. Specifically, when holes are drilled (using laser or mechanical drills) to form thru-holes, end segments of the fiberglass fibers can extend into the holes and, if so, must be removed prior to metallization. This removal, in turn, creates the need for additional pretreatment steps such as the use of glass etchants to remove the glass fibrils extending into the holes, subsequent rinsing, etc. If the glass is not removed, a loss of continuity might occur in the metal deposit. In addition, both continuous and semi-continuous glass fibers add weight and thickness to the overall final structure.

Additionally, since lamination is typically at a temperature above 150° C., the resinous portion of the laminate usually shrinks during cooling to the extent permitted by the rigid copper cladding, which is not the case for the continuous strands of fiberglass or other continuous reinforcing material used. The strands thus take on a larger portion of the substrate's volume following such shrinkage and add further to complexity of manufacture in a high density product. If the copper is etched to form a discontinuous pattern, laminate shrinkage may not be restrained even to the extent above by the copper cladding. Obviously, this problem is exacerbated as feature sizes (line widths and thicknesses, and thru-hole diameters) decrease. Consequently, even further shrinkage may occur. The shrinkage, possibly in part due to the presence of the relatively large volume percentage of continuous or semi-continuous fiber strands in the individual layers used to form a final product possessing many such layers, may have an adverse affect on dimensional stability and registration between said layers, adding even more problems for the PCB manufacturer.

Furthermore, the presence of glass fibers, especially woven glass fibers, substantially impairs the ability to form high quality, very small thru-holes using a laser. Glass cloth has drastically different absorption and heat or ablation properties than any thermoset or thermoplastic matrix resin. In a typical woven glass cloth, for example, the density of glass a laser might encounter can vary from approximately 0% in a window area to approximately 50% by volume or even more, especially in an area over a cloth "knuckle". This wide variation in encountered class density leads to problems obtaining the laser power for each thru-hole and may result in wide variations in thru-hole quality.

Still further, the presence of glass fibers contributes to an electrical failure mode known as CAF growth. CAF (cathodic/anodic filament) growth often results in an electrical shorting failure which occurs when dendritic metal filaments grow along an interface (typically a glass fiber/epoxy resin interface), creating an electrical path between two features which should remain electrically isolated. Whether continuous (like woven cloth) or semi-continuous (like chopped fiber matts), glass fiber lengths are substantial in comparison to the common distances between isolated internal features, and thus glass fibers can be a significant detractor for PCB insulation resistance reliability. While the use of glass mattes composed of random discontinuous chopped fibers (in comparison to the longer fibers found in continuous structures) can largely abate the problem of inadequate laser drilled thru-hole quality, such mattes still contain fibers with substantial length compared to internal board feature spacings and, in some cases, offer virtually no relief from the problem of CAF growth.

One improvement in the manufacture of products such as PCBs is described in U.S. Pat. No. 5,246,817. In accordance with this patent, the manufacturing process consists of the sequential formation of layers using photosensitive dielectric coatings and selective metal deposition procedures. The first layer of the board is formed over a temporary or permanent carrier that may become an integral part of the board. When the carrier is a circuit, the process comprises formation of a dielectric coating over the circuit with imaged openings defining the thru-holes. The imaged openings may be obtained by exposure of a photosensitive dielectric coating to activating radiation through a mask in an imaged pattern followed by development to form the imaged openings. Alternatively, imaging may be by laser ablation in which case, the dielectric material need not be photosensitive. Metal is deposited into the recesses within the dielectric coating to form the conductive thru-holes. Thereafter, an additional layer of dielectric is coated onto the first dielectric layer, imaged in a pattern of circuit lines, and the recesses are then plated with metal. Alternatively, after imaging the first dielectric coating, it may be coated with a second dielectric coating and imaged and the recesses plated with metal to form the thru-holes and circuit lines simultaneously. By either process, the walls of the imaged opening or recesses in the dielectric coating contain metal as it deposits during plating and assures a desired cross-sectional shape of the deposit. Plating desirably fills the entire recess within the imaged photosensitive coating. The process, obviously very complex and costly, is repeated sequentially to form sequential layers of circuits and thru-holes.

Another example of a PCB with a specific dielectric material composition is described in U.S. Pat. No. 6,207,595 in which the dielectric layer's fabric material is made from a cloth member having a low enough content of particulates and a sufficient quantity of resin material to completely encase the cloth member including the particulates, so that the resin material extends beyond the highest protrusions of the cloth member (i.e. the fabric material is thicker and will pass a certain test standard (in '595, the known HAST level A test). Thus, the woven cloth is known to include a quantity of particulates, which term is meant in '595 to include dried film, excess coupler, broken filaments, and gross surface debris. A process is described where a sizing of polyvinyl alcohol, corn starch and a lubricant of oil is applied to the strands of fiber prior to weaving in order to improve the weaving process and minimize breakage of the strands. After weaving, the sizing is removed by a firing step to clean the filaments of lubricants and other materials. However, some sizing is randomly left behind as particulates. Encasing the woven cloth including the particulates is a quantity of hardened resin material. The resin may be an epoxy resin such as one often used for "FR4" composites ("FR4" has become a conventional, abbreviated name for the resulting substrates and often also for the resins forming part thereof, and is based in part on the flame retardant (hence the "FR" designation) rating of these established products). A resin material based on bismaleimide-triazine (BT) is also acceptable for the structure in this patent. More preferably, the resin is a phenolically hardenable resin material known in the PCB industry. This patent thus requires continuous fibers (those extending across the entire width (or length) of the dielectric layer except for possible inadvertent interruptions caused by drilling of the thru-holes needed in the final product, causing these fibers to become what might be called as "broken." The aforementioned problem with fiber strands exposed to the holes is thus possible in this patent's process and resulting structure.

In U.S. Pat. No. 5,418,689, there is described a PCB product wherein the dielectric substrate can include a thermoplastic and/or thermosetting resin. Thermosetting polymeric materials mentioned in this patent include epoxy, phenolic base materials, polyimides and polyamides. Examples of some phenolic type materials include copolymers of phenol, resorcinol, and cresol. Examples of some suitable thermoplastic polymeric materials include polyolefins such as polypropylene, polysulfones, polycarbonates, nitrile rubbers, ABS polymers, and fluorocarbon polymers such as polytetrafluoroethylene, polymers of chlorotrifluoroethylene, fluorinated ethylenepropylene polymers, polyvinylidene fluoride and polyhexafluoropropylene. The dielectric materials may be molded articles of the polymers containing fillers and/or reinforcing agents such as glass filled polymers. "FR4" epoxy compositions that are employed in this patent contain 70–90 parts of brominated polyglycidyl ether of bisphenol-A and 10–30 parts of tetrakis (hydroxyphenyl) ethane tetraglycidyl ether cured with 3–4 parts of dicyandiamide, and 0.2–0.4 parts of a tertiary amine, all parts being parts by weight per hundred parts of resin solids. Another "FR4" epoxy composition may contain about 25 to about 30 parts by weight of a tetrabrominated digylcidyl ether of bisphenol-A having an epoxy equivalent weight of about 350 to about 450; about 10 to about 15% by weight of a tetrabrominated glycidyl ether of bisphenol-A having an epoxy equivalent weight of approximately 600 to about 750 and about 55 to about 65 parts per weight of at least one epoxidized nonlinear novolak having at least 6 terminal epoxy groups; along with suitable curing and/or hardening agents. A still further "FR4" epoxy composition contains 70 to 90 parts of brominated polyglycidyl ether of bisphenol-A and 10 to 30 parts of tetrakis (hydroxyphenyl) ethane tetraglycidyl ether cured with 0.8–1 phr of 2-methylimidazole. Still other "FR4" epoxy compositions employ tetrabromobisphenol-A as the curing agent along with 2-methylimidazole as the catalyst.

In U.S. Pat. No. 6,323,436, PCBs are prepared by first impregnating a non-woven aramid chopped fiber mat or a thermoplastic liquid crystalline polymer (LCP) paper instead of the reinforcement typically used in the electronics industry, described in this patent as a woven glass fabric. This aramid reinforcement matte is comprised of a random (in-plane) oriented mat of p-aramid (poly(p-phenylene terephthalamide) fibers comprised of Kevlar (Kevlar is a registered trademark of E.I. duPont deNemours and Company), and has a dielectric constant of 4.0 as compared to 6.1 for standard E-glass cloth. The lower permittivity of the non-woven aramid reinforcement provides for faster signal propagation, allowing increased wiring density and less crosstalk, which becomes increasingly important for high I/O chips and miniaturization. Since the p-aramid fibers are transversely isotropic and have an axial CTE of about –3 to about –6 ppm/degree Celsius (hereinafter C.). below the glass transition temperature when combined with a thermosetting resin, the final composite described in this patent is said to possess a CTE which can be controlled and adjusted to match that of silicon or semiconductor chips in the range of about 3 to about 10 ppm/degree C. The thermoplastic liquid crystal polymer (LCP) paper is a material called Vecrus (Vecrus is a registered trademark of Hoechst Celanese Corp.), which uses the company's Vectra polymer as part thereof (Vectra also being a registered trademark of Hoechst Celanese Corp.). According to this patent, the paper has a dielectric constant of 3.25, a dissipation factor of 0.024 at 60 Hz., a UL 94-V0 rating and an in-plane CTE of less than 10 ppm/degree. C. The alleged advantages of this material over the aramid mat are the lower dielectric constant and very low moisture absorption, allegedly less than 0.02%. The non-woven aramid or LCP paper is used in conjunction with a thermosetting resin to form the final composite substrate. Examples of thermosetting resins useful in this patent include epoxy, cyanate ester, bismaleimide, bismaleimide-triazine, maleimide or combinations thereof. The resin-impregnated low CTE reinforcement is then partially cured to a "B"-stage to form the prepreg, and then the prepreg is cut, stacked, and laminated to form a subcomposite with exterior copper sheets.

Another form of dielectric materials known for use in circuitized substrates include those known as "expanded PTFE" materials, PTFE of course being the designate for polytetrafluoroethylene. A more common example of such material is the aforementioned Teflon, sold by E.I. DuPont de Nemours and Company. In U.S. Pat. No. 5,652,055, for example, there is described an adhesive sheet (or "bond film") material suitable to serve as adhesive layers in a variety of adhesive applications, such as in circuit board laminates, multi-chip modules, and in other electrical applications. The adhesive sheet is described as being constructed from an expanded polytetrafluoroethylene (PTFE) material, such as that taught in U.S. Pat. No. 3,953,566. Preferably, the material is filled with an inorganic filler and is constructed as follows. A ceramic filler is incorporated into an aqueous dispersion of dispersion-produced PTFE. The filler in small particle form is ordinarily less than 40 microns in size, and preferably less than 15 microns. The filler is introduced prior to co-coagulation in an amount that will provide 10 to 60%, and preferably 40 to 50% by weight filler in the PTFE, in relation to the final resin-impregnated composite. The filled PTFE dispersion is then co-coagulated, usually by rapid stirring. The coagulated filled PTFE is then added. The filled material is then lubricated with a common paste extrusion lubricant, such as mineral spirits or glycols, and then paste extruded. The extrudate is usually calendared, and then rapidly stretched to 1.2 times to 5000 times, preferably 2 times to 100 times, per this patent, at a stretch rate of over 10% per second at a temperature of between 35 degrees C. and 327 degrees C. The lubricant can be removed from the extrudate prior to stretching, if desired. The resulting expanded, porous filled PTFE is then imbibed with adhesive by dipping, calendaring, or doctor blading on a varnish solution of about 2% to 70% adhesive in solvent. The wet composite is then affixed to a tenter frame, and subsequently B-staged at or about 165 degrees C. for 1 to 3 minutes. The resulting sheet adhesive thus obtained typically consists of: (a) 9 to 65 weight percent PTFE; (b) 9 to 60 weight percent inorganic filler, in the form of particulate; and (c) 5 to 60 weight percent adhesive imbibed within the porous structure of the filled PTFE web.

Various other types of expanded-PTFE substrate materials are described in the aforementioned U.S. Pat. No. 3,953,566, and also in U.S. Pat. Nos. 4,187,390 and 4,482,516, as well as many others. U.S. Pat. No. 4,187,390 is particularly interesting because it delves substantially into both nodes and fibrils used as part of such substrate materials, breaking these down into such dimensional constraints as node height, node width, node length, and fibril length.

Still other examples of methods of making circuitized substrates such as PCBs are described and illustrated in the several documents cited in the aforementioned co-pending application Ser. No. 10/812,890, the teachings of which, in addition to those other patents listed above, are incorporated herein by reference.

The examples of dielectric materials mentioned in many of the above documents are considered to have a limited usefulness as a substrate dielectric because of what can be referred to as high moisture absorptivity. That is, these dielectric materials tend to absorb what might be referred to as undesirable levels of moisture (a primary example being water) during processing and subsequent storage thereof. This unacceptable moisture results in the dielectric structure (at least one layer which is then circuitized during the processing) having unpredictable dimensional stability during processing and delamination or blistering in the final component or board assembly process. By the term "high moisture absorptivity" as used herein is meant a level of moisture (water and other fluid materials, including other processing liquids and even gases to which the dielectric material is exposed during processing, storage and shipping) absorption greater than about 0.3 percent, as measured at a temperature of about 22° C. for a time period of about 24 hours. A specific example used in the industry is when the dielectric layer is immersed in water at this temperature for this time period. An absorption rate greater than about this 0.3 percent is deemed unacceptable for the reasons given above.

As described herein, the present invention represents a significant improvement over processes such as those above in the production of circuitized substrates such as PCBs. One particularly significant feature of this invention is the provision of a dielectric material which includes a polymer resin with low moisture absorptivity and a nodular fluoropolymer filler, and, significantly, also does not include continuous or semi-continuous glass fibers or the like as part thereof. Low moisture absorptive polymer resin is defined herein as a resin that absorbs less than about 0.15 percent by weight moisture at room temperature (22° C.) for a period of 24 hours, while immersed in water. Utilization of this new material eliminates the need for the aforementioned glass fibers and the like within the dielectric layer of the substrate, the fibers heretofore deemed necessary to provide sufficient strength in the resulting dielectric layer of many substrate dielectric materials to stand subsequent processing (especially the strenuous pressures and temperatures of lamination) of the layers into a final, multilayered structure. Elimination of continuous, or semi-continuous, length strands of these materials facilitates thru-hole formation and thus enhances the opportunities for reduced line widths and thicknesses, satisfying design requirements for greater board densities.

It is believed that such an invention will represent a significant advancement in the art.

OBJECTS AND SUMMARY OF THE INVENTION

It is a primary object of the invention to enhance the art of circuitized substrates.

It is another object of the invention to provide a new dielectric material for use in a circuitized substrate which includes enhanced moisture adsorption properties to result in a dielectric layer than be processed efficiently, utilizing the methods as taught and described herein.

It is another object to provide a new and unique method of making a circuitized substrate which is adaptable to current manufacturing procedures, utilizes the new dielectric material defined herein, and which is accomplished by more simplified usage thereof to thereby result in a product of reduced cost.

According to one embodiment of the invention, there is provided a circuitized substrate comprising a first layer comprised of a dielectric material including a low moisture absorptive polymer resin material and a nodular fluoropolymer web encased within the low moisture absorptive polymer resin material. The first layer does not include continuous or semi-continuous fibers or the like as part thereof. The substrate further includes at least one circuitized layer positioned on the first layer.

According to another embodiment of the invention, there is provided an electrical assembly comprising a circuitized substrate including a first layer comprised of a dielectric material including a low moisture absorptive polymer resin and a nodular fluoropolymer web within the low moisture absorptive polymer. The first layer does not include continuous or semi-continuous fibers or the like as part thereof. The assembly further comprises at least one circuitized layer positioned on the first layer; and at least one electrical component positioned on and electrically coupled to the circuitized substrate.

According to yet another embodiment of the invention, there is provided a method of making a circuitized substrate, the method comprising providing a first layer comprised of a dielectric material including a low moisture absorptive polymer resin and a nodular fluoropolymer web encased within the low moisture absorptive polymer resin. The first layer does not include continuous or semi-continuous fibers or the like as part thereof. The method further includes positioning at least one circuitized layer on the first layer of dielectric material.

According to still another embodiment of the invention, there is provided a multilayered circuitized structure comprising a first circuitized substrate portion including a first layer having a first pattern of conductive thru-holes therein and comprised of a dielectric material including a low moisture absorptive polymer resin material and a nodular fluoropolymer web encased within the low moisture absorptive polymer resin material. The first layer does not include continuous or semi-continuous fibers or the like as part thereof. The structure further includes second and third circuitized substrate portions positioned on opposite sides of the first circuitized substrate portion, each having a second pattern of interconnecting thru-holes therein, the first circuitized substrate portion providing electrical interconnection between the second and third circuitized substrate portions.

According to yet another embodiment of the invention, there is provided an information handling system comprising a housing, a circuitized substrate positioned within the housing and including a first layer comprised of a dielectric material including a low moisture absorptive polymer resin material and a nodular fluoropolymer web encased within said low moisture absorptive polymer resin material. The first layer does not include continuous fibers or the like as part thereof, and the system further includes at least one circuitized layer positioned on said first layer and at least one electrical component positioned on and electrically coupled to the circuitized substrate.

BEST MODE FOR CARRYING OUT THE INVENTION

For a better understanding of the present invention, together with other and further objects, advantages and capabilities thereof, reference is made to the following disclosure and appended claims in connection with the above-described drawings. Like figure numbers will be used from FIG. to FIG. to identify like elements in these drawings.

"Information handling system" as used herein shall mean any instrumentality or aggregate of instrumentalities primarily designed to compute, classify, process, transmit, receive, retrieve, originate, switch, store, display, manifest, measure, detect, record, reproduce, handle or utilize any form of information, intelligence or data for business, scientific, control or other purposes. Examples include personal computers and larger processors such as computer servers and mainframes. Such products are well known in the art and are also known to include PCBs and other forms of circuitized substrates as part thereof, some including several such components depending on the operational requirements thereof.

The term "web" as used herein is meant a network or membrane material having an interlaced or lattice-like structure and which is of sufficient porosity such that it can be positioned within and not adversely affect a resinous material of the types defined herein when used in products such as those defined herein, e.g., PCBs, chip carriers, etc. Such "web" material must also possess sufficient porosity to allow the resinous material to flow through it during processes, e.g., lamination, utilized in the manufacture of such products.

Figure 1:
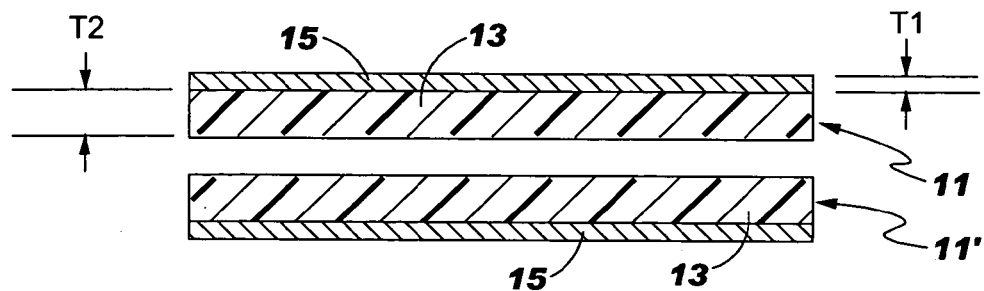
FIGS. 1–6 represent steps utilized to produce a circuitized substrate in accordance with one embodiment of the invention, FIGS. 3–6 being on a slightly larger scale than those of FIGS. 1 and 2.

FIG. 1 illustrates an initial step in forming a circuitized substrate as defined herein. As understood from the following, a key attribute of the present invention is the utilization of a dielectric material as part of the substrate which enables the provision of high density arrays of thru-holes within the substrate while preventing electrical shorting or the like between closely spaced, adjacent holes. That is, very highly dense concentrations of relatively narrow (in diameter) thru-holes are capable of being provided in this unique dielectric layer which can then be rendered conductive (typically, plated) to provide highly dense circuit connections between designated conductive layers (e.g., signal, power and/or ground) within the final structure incorporating the circuitized substrate. Most significantly, this new dielectric material possesses very low moisture absorptivity and, equally significant, does not include continuous or semi-continuous fibers such as fiberglass fibers required in so many known dielectric layers, the most well known of same being the aforementioned "FR4" material. As explained, use of such fibers is often deleterious when producing substrates during the hole forming and plating stages because of fiber or its material intrusion within the holes which can form a base for a conductive path to adjacent conductive holes. A singular electrical short of this type can render a final PCB or chip carrier inoperative for its intended purpose, a costly manufacturing expense. The unique material taught herein is able to overcome this deficiency while assuring relatively high dielectric reliability and a relatively thin final layer, both highly desirable if the final product (e.g., chip carrier or PCB) using the substrate is to meet many of today's high density requirements. As further mentioned above, the new dielectric material of the invention possesses low moisture absorption properties which are extremely beneficial because it provides for ease of processing (including during lamination when temperatures can exceed 245 deg. C.) and a highly desirable low dielectric. Layers including this material possess sufficient strength and durability to withstand the rigors, particularly the high temperatures and pressures associated with lamination, of PCB processing. Utilization of the embedded web material assures such strength and durability while, significantly, substantially eliminating the afore-defined adverse effects of fiber intrusion into formed thru-holes. This defined web material also significantly allows for proper flow of the resin during processing (again, typically at the high temperatures and pressures of lamination) through the web openings, to assure a porous-free, solid layer of combined material. Also, the resulting product is produced using regular PCB manufacturing processes without any significant modification thereto, thereby keeping product costs down.

The dielectric material used to form the circuitized substrate of the various embodiments of the invention defined herein utilizes a polymer (preferably an organic) resin material having, as stated above, very low moisture absorptivity in combination with a nodular (preferably free-standing) fluoropolymer web encased within the resin, the combination forming a layer upon which circuitry may then be formed. A preferred fluoropolymer for the web is polytetrafluoroethylene (PTFE), one commercially available example being Teflon (a trademark of the E.I. dupont deNemours & Company). Other fluoropolymers that can be employed include those from the family of Teflon PFA fluoropolymers presently also available from dupont. Another preferred fluoropolymer web material is perfluoroalkoxy fluorocarbon, which has a dielectric constant of 2.1 over a wide range of frequencies and temperatures, a very low dissipation factor (0.0002), a relatively high melting point (approx. 304 deg. C.) acceptable for high temperature lamination, and a relatively high tensile strength (over 9,000 pounds per square inch (PSI) in the machine direction. It is believed that webs comprised of these materials, especially PTFE, when impregnated with organic resins such as those defined below, offer considerable relief to the afore-mentioned problem of CAF growth. Preferably, the web will comprise from about 10% to about 89% by volume of the final layer of dielectric material.

In a preferred embodiment, the dielectric resin material is a high glass transition temperature (Tg), dicyandiamide (DICY)-free epoxy polymer resin available from Huntsman Advanced Materials in Brewster, N.Y. under the product name Araldite LZ-8213. This particular resin has an epoxy equivalent weight of about 280–400, a viscosity of approx. 300–900 cps, a solids content percentage of about 70–73, a boiling point of about 80 deg. C. and a molecular weight of about 1200–1400 grams per mole. It is a thermosetting polymer. Optionally, a high molecular weight, reactive thermoplastic resin such as InChem PKHS-40 resin (available from InChem Corporation in Rock Hill, S.C.) may be used, including in combination with the above-identified resin material. This material will impart toughness and coating flake-off resistance. InChem PKHS-40 resin has a specific gravity of 0.965, a solid weight percent of about 39–41, a boiling point of 80 deg. C., and, importantly, a viscosity within the range of about 4500 to 7000 centipoise (cp) at 25 deg. C. If used on combination with another resin, the PHKS-40 resin should comprise from about 3 percent to about 25 percent by weight of the total resin composition and about 1.5 percent to about 12.5 percent of the total layer volume. It is also possible for the InChem PHKS-40 to be used on its own as the sole resin material in the final composition.

It is also within the scope of the invention to add a silica material to the resin material. A preferred example is thixotrope silica, sold under the product name resin Aerosil R-972 by Degussa Corporation of Teterboro, N.J. Aerosil R-972 is a hydrophobic amorphous fumed silica having a melting point of 1700 deg. C., a specific gravity of 2.2, and a pH of about 3.6–5.0, and can be added to achieve an improved balance between the solution viscosity of the solvent containing coating varnish and the melt viscosity of the B-staged (see more below) dielectric coating.

Suitable catalysts for the epoxy include amines such as the imidazoles, tertiary amines such as benzyldimethylamine, 1.3-tetramethyl butane diamine, tris (dimethylaminomethyl) phenol, pyridine, and triethylenediamine, and acidic catalysts, such as stannous octoate. A solvent such as methyl ethyl ketone may be added to dissolve the various resins and permit coating of the selected carrier. Finally, a coupling agent (a preferred example being a silane such as Dow-Corning Z-6040, available from Dow-Corning Corporation, Midland, Mich.) may be added to improve web to resin interfacial adhesion. This particular silane from Dow-Corning contains reactive glycidoxy and methoxy groups and, significantly, reacts with (or "couples") organic polymers and inorganic surfaces. It is a low viscosity fluid with a specific gravity of 1.07 at 25 deg. C. It is designated 3glycidoxypropyltrimethox-silane and is one of a series of organofunctional silane chemicals from the Dow-Corning Corporation.

A web of nodular PTFE was coated (solution-impregnated) with the above resin composition. The solvent was evaporated and the resulting free standing film was B-staged at 140° C. for about 3 minutes to produce a final usable film. By the term "B-staged" is meant that during the heating to the temperature indicated the material assumes a harder state than its previous "C-stage" state. Such states are indicative of the relative hardness of the material at a certain stage in its processing.

Dielectric layers produced using the above material possess the following key electrical, thermal, physical and thermal expansion properties, as defined by process development analyses:

| Electrical Properties | |
| --- | --- |
| Dielectric constant (Dk) at 1–2.5 GHz | 3.06 |
| Loss factor at 1 MHz | 0.016 |
| Thermal Properties | |
| Tg (DSC mid point) (deg. C.) | 175 |
| Tg (deg C.) | 173 |
| Decomposition Temperature (deg. C.) | 322 |

-continued

| Thermal Expansion | |
| --- | --- |
| Below Tg (ppm/deg. C.) | 74 |
| Above Tg (ppm/deg. C.) | 145 |
| Physical Properties | |
| % moisture, after 24 hours | 0.15 |
| % moisture after 1 hour | 0.25 |
| Elongation (%) | 3.0 |

The resulting layer composite structure (or free-standing film) of finally hardened resin material and encased web provided herein has very low moisture absorptivity (less than 0.15% moisture absorption after being immersed for 24 hours in water at 22° C. (room temperature)) and makes it very unique as a substrate for building PCBs and chip carriers. Equally important, this and additional layers, when staged as defined, are then readily receptive to subsequent circuitization processing using conventional photolithographic processing. In a referred embodiment, the desired circuitry is formed of copper and applied using such processing. Photolithographic processing of substrates of this type is well known in the PCB field and further description is not deemed necessary.

It has been discovered that when drilling (e.g., typically using a laser, described below) thru-holes in the above material, highly dense concentrations of such hole patterns are attainable without electrical shorting of the holes after plating of the sidewalls thereof had occurred. That is, the plating material (typically copper) does not migrate from thru-hole to thru-hole, as occasionally occurred when continuous and/or semi-continuous fiberglass and other fibrous materials were utilized.

In one embodiment of the invention, it was possible to drill a total of 10,000 holes within one square inch of dielectric layer, representing an extreme example of the high density hole patterns attainable using the unique teachings herein. Pattern densities ranging from about 500 holes per square inch to about 10,000 holes per square inch are attainable using the present invention's teachings. As stated, a laser is preferably used for such drilling, and in particular, a YAG laser, which may operate at speeds of 20–50 thru-holes per second each having 2 mil diameters and extending through the dielectric layer, up to 250 thru-holes per second having similar diameters extending only partly into the dielectric layer (also referred to as "blind vias" as mentioned above).

As further understood from the description herein, a particular use for the circuitized substrate formed herein is as part of a chip carrier or a PCB or other electronic packaging product such as those made and sold by the Assignee of the instant invention. One particular example is a chip carrier sold under the name Hyper-BGA chip carrier (Hyper-BGA being a registered trademark of the Assignee, Endicott Interconnect Technologies, Inc.). The invention is of course not limited to chip carriers or even to higher level PCBs. It is also understood that more than one such circuitized substrate (also referred to as a "core", a specific example being what is referred to as a "power core" if the core includes one or more power planes and is thus to serve primarily in this capacity) may be incorporated within such a carrier or PCB, depending on operational requirements desired for the final product. As defined below, the "core" can be readily "stacked up" with other layers, including conductors and dielectric, and bonded together (preferably using conventional PCB lamination processing) to form the multilayered carrier or multilayered PCB. The laminate so formed is then subjected to further processing, including conventional photolithographic processing to form circuit patterns on the outer conductive layers thereof. As described hereinbelow, such external patterns can include conductive pads on which conductors such as solder balls can be positioned to connect the structure to other components such as semiconductor chips, PCBs and chip carriers if so desired. The unique teachings of this invention are thus adaptable to a multitude of electronic packaging products. Significantly, the invention enables incorporation of the circuitized substrate (e.g., if a dense "core") with its highly dense thru-hole patterns and interconnection capabilities within a larger multilayered structure in which the other layered portions do not possess such densification and operational capabilities. Thus, a "standard" multilayered product can be produced for most of its structure and the unique subcomponent taught herein simply added in as part of the conventional processing of such a "standard". If the circuitized substrate core is internally positioned, it enables highly dense connections between other, less dense portions of the multilayered product, thus giving said product the unique capabilities of the invention in at least a portion thereof.

Figure 2:
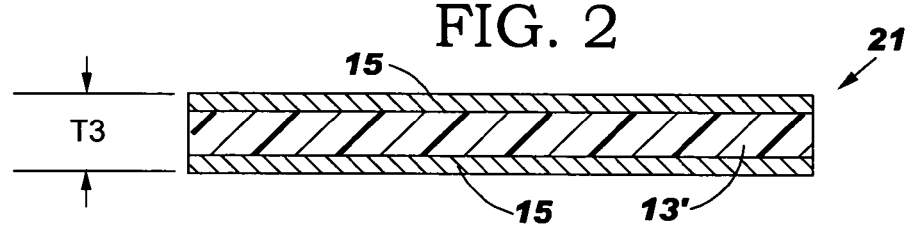

In FIG. 1, an initial, preferred step in forming a circuitized substrate as taught herein, involves bringing together two layered members 11 and 11'. Each member preferably includes a relatively thin layer 13 of dielectric material having the composition defined herein and a conductive layer 15 (preferably copper) thereon. Layers 13 are each preferably of a thickness (T2) of about 1–4 mils (thousandths of an inch) with a preferred thickness being 2 mils (0.002 inch). Each conductive layer is even less in thickness (T1), within the range of only about 0.25 mils to about 1.5 mils thick. A preferred thickness is 0.5 mils. Each of the dielectric layers, including a resin as part of the composition, is preferably in what is known in the art as a "C-stage" state. Layered members 11 and 11' are aligned and bonded together using conventional PCB lamination processing. In one example, a total pressure of about 400 pounds per square inch (PSI) was used, at a temperature of about 188 deg. C., for a period of about 90 minutes. The result is a laminated substrate 21 (FIG. 2) having outer conductive layers 15 each of substantially the same thickness as above but a common interim dielectric layer 13' having a compressed thickness of about 4.2 mils, giving the overall final substrate a thickness (T3) of about 5.6 mils. The interim dielectric material 13', as a result of such lamination, is now in what is referred to in the art as a "B-stage" state, as mentioned hereinabove. This substrate will now serve to form the base for the circuitized substrate defined herein, which, as also defined, may serve as a "core" substrate for a thicker, multilayered product such as a PCB or chip carrier.

Figure 3:
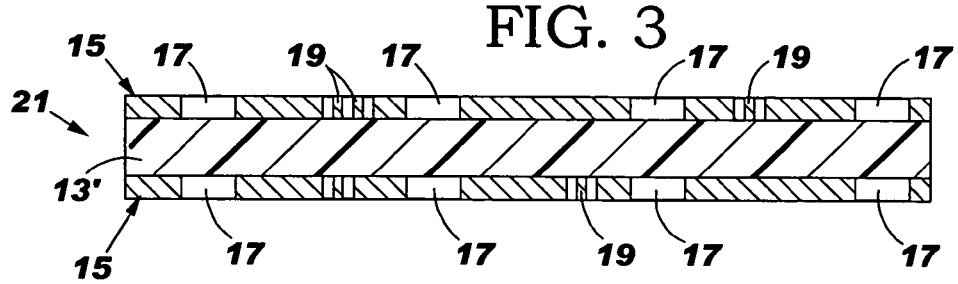

In FIG. 3, substrate 21 (now shown on a larger scale than in FIGS. 1 and 2 for illustration purposes) is now subjected to a conventional photolithographic step in which outer conductive layers 15 are "circuitized." That is, layers 15 are processed using known processing to form a desired pattern thereon. This pattern will include, at a minimum, several openings 17 in each layer which are aligned opposite each other as shown. In addition, it is also within the scope of the invention to provide additional circuit features such a lines and/or pads 19 within one or both layers. If substrate 21 is to serve as a "power core", layers 15 will typically only include openings 19 therein. However, if one or both layers 15 are to function in another capacity, e.g., as a signal layer, then other patterns may be provided. The patterns in FIG. 3 (and FIGS. 4–6) are thus not meant to limit the scope of the invention.

Figure 4:
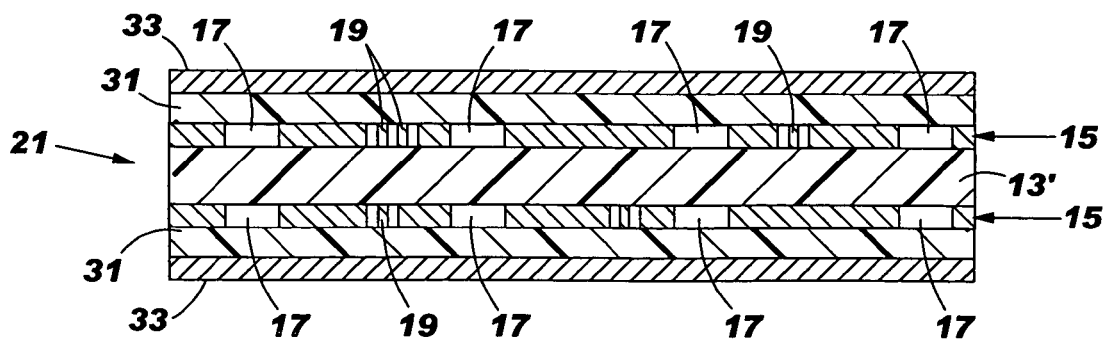
Figure 5:
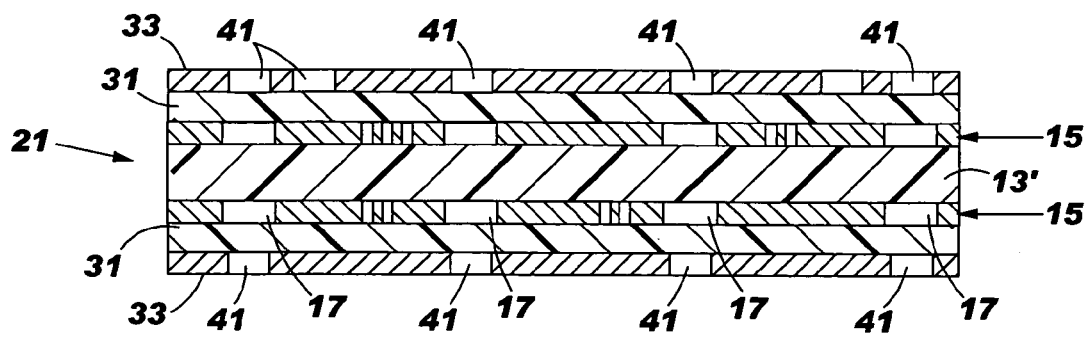
Figure 6:
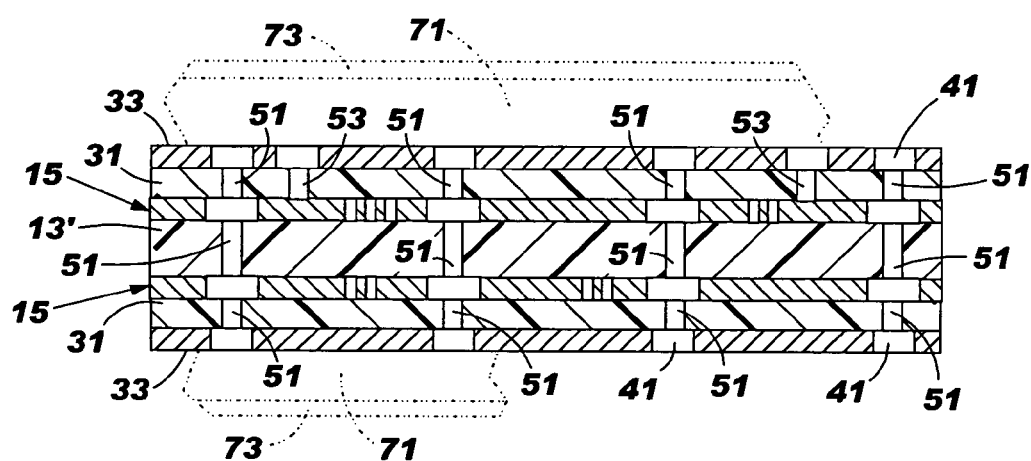

In FIG. 4, the substrate 21 is shown to include an additional layer 31 of dielectric material on opposite sides thereof, each layer preferably including a thin conductive (e.g., copper) layer 33 thereon. In one example of the invention, layers 31 and 33 are each comprised of the same materials and thicknesses as layers 13 and 15 in FIG. 1 and are laminated onto substrate 21 using lamination processes known in the art. Following lamination to attachment, each of the conductive layers 33 is "personalized" to include a plurality of openings 41 therein which align with respective ones of the openings 17 in the conductive layer 15 located adjacent thereto (but separated by the interim layer 31), as seen in FIG. 5. It is noteworthy that at least one opening 41 is aligned with a corresponding opening 17, but that other, perhaps smaller openings 41 may also be provided which are not so aligned, but instead align with other portions of the circuit formed on layer 15 (if one has been so formed). With openings 41 formed, thru-holes are drilled within the FIG. 5 structure using a YAG laser as defined above. The laser drills thru-holes through the entire thickness of the FIG. 5 structure wherever paired, aligned openings 17 and corresponding aligned openings 41 are present, as seen in FIG. 6. In one embodiment, a total of 10,000 holes, each having a diameter of only about 2 mils, were provided in each square inch of the structure in these aligned orientations. This represents, again, the highly dense patterns attainable using the teachings of this invention.

In addition to the highly dense pattern of thru-holes 51 which extend through the entire thickness of the FIG. 5 structure, as seen in FIG. 6, lesser depth thru-holes 53 ("blind vias") may also be formed simultaneously with the formation of holes 51 to reach only the conductive layer 15. The purpose of these latter holes is to eventually form an electrical connection between conductive layer 33 and layer 15 (e.g., from selected signal lines on one to lines on another, again assuming layer 15 is to function as a signal carrying conductive plane), adding greater versatility to the invention if so used. Layer 15 could also serve as a ground layer and thus providing grounding, if so desired. It is understood that thru-holes 51 and 53 (if used) are then to be plated with conductive material, a preferred material being copper having a thickness of only about 0.5–0.75 mils. The preferred plating processes for these and the other thru-holes described herein may be either electrolytic or electroless, depending on the plating equipment available for such plating. Electrolytic and electroless plating of thru-holes is well known in the art so further description is not deemed necessary.

Also seen in FIG. 6 is the addition of yet another dielectric layer 71 (in phantom) on opposite sides of the structure formed with thru-holes therein, and an additional conductive layer 73 (also in phantom) on each of the dielectric layers. This drawing FIG. is intended to represent the fact that several additional dielectric and conductive layers may be added to the FIG. 6 structure to form a larger multilayered final product such as a PCB or laminate chip carrier having more than the number of layers shown in FIGS. 3–6. Further, it is also possible to incorporate more than one such internal circuitized substrate "core" such as shown in FIG. 6 (or even in FIG. 3) within such a larger, thicker structure to thus afford the final structure with the teachings of the invention at more than one location therein. To this end, the embodiments of both FIG. 3 and the added layered embodiment of FIGS. 4–6 can also be considered as such "cores." Finally, it is also within the scope of the invention to utilize all of the FIG. 3 structures only to form a multilayered composite, utilizing known "sticker sheet" dielectric layers between each aligned pair during lamination thereof into the final structure. Whichever the choice, the thru-holes in each of the dielectric-conductive subcomposites (such as that shown in FIG. 4) will be interconnected electrically, thereby providing conductive paths through selected portions of the final structure, including through the entire structure itself, if desired. If, for example, three subcomposites of the type shown herein are combined to form a multilayered final structure (e.g., a multilayered PCB), then it is clear that the thru-holes of the interim subcomposite will provide electrical interconnection, once rendered conductive such as by the afore-defined plating operation, between the thru-holes of the two outer subcomposites bonded on opposite sides of this interim subcomposite.

Figure 7:
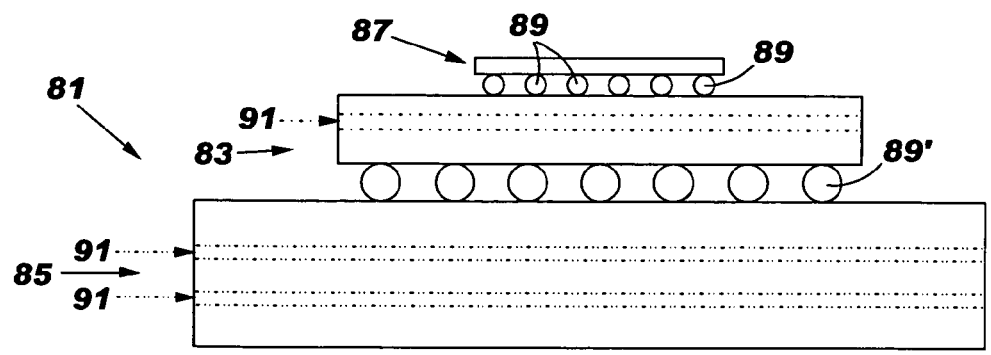
FIG. 7, on a much smaller scale than FIGS. 1 and 2, illustrates an electrical assembly which may utilize one or more of the circuitized substrates defined herein and made in accordance with the teachings herein.
Figure 8:
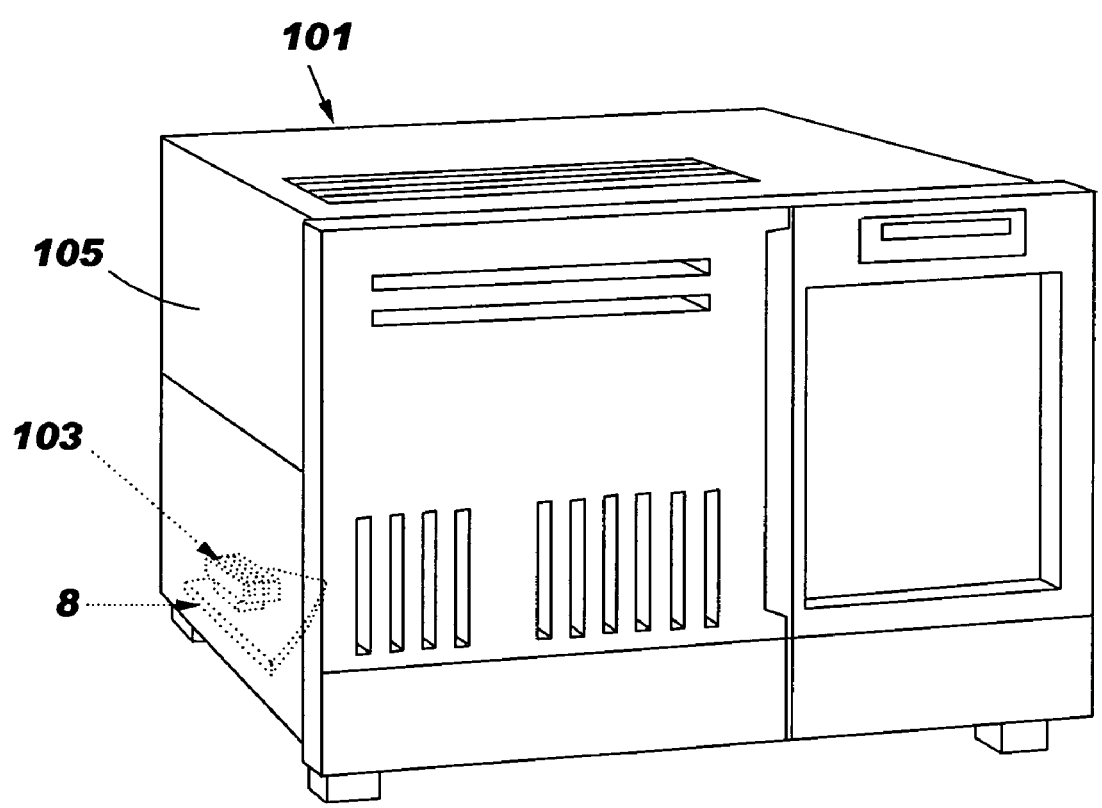
FIG. 8 represents an information handling system according to one aspect of the invention which is capable of utilizing one or more of the circuitized substrates taught herein.

FIG. 7 represents one example of an electrical assembly 81 that may be formed using the circuitized substrates taught herein. As stated, each substrate so formed in accordance with the teachings herein may be utilized within a larger substrate of known type such as a PCB, chip carrier or the like. FIG. 7 illustrates two of these larger components, one being a chip carrier 83 and the other a PCB 85. PCB 85 is positioned within and electrically coupled to an electronic assembly such as an information handling system as shown in FIG. 8, which may be in the form of a personal computer, mainframe, computer server, etc. Chip carrier 83, as shown, is typically positioned on and electrically coupled to an underlying substrate such as PCB 85. Such a carrier also typically has a semiconductor chip 87 mounted thereon and also electrically coupled to the carrier. In the embodiment of FIG. 7, the connections between chip and carrier and between carrier and PCB are accomplished using solder balls 89 and 89', respectively. Such connections are known in the art and further description is not considered necessary. The significance of FIG. 7 is to show the use of one or more of the circuitized substrates 91 (in phantom) of the invention in the chip carrier 83 and PCB 85, thus forming part thereof. Two substrates 91 are shown as used within PCB 85, while only one is shown within carrier 83. As mentioned above, the invention is not limited to the numbers shown. For example, three or more substrates 91, each forming a particular circuitized "core" (e.g., a "power core") within the PCB, may be utilized to afford the PCB the highly advantageous teachings of the invention. Or, as stated, the entire PCB or chip carrier laminate may be comprised of dielectric layers as taught here.

In FIG. 8, there is shown an information handling system 101 in accordance with one embodiment of the invention. System 101 may comprise a personal computer, mainframe computer, computer server, or the like, several types of which are well known in the art. System 101, as taught herein, may include the electrical assemblies as shown in FIG. 7, including both PCB 85 and carrier 83, these being represented by the numeral 103 in FIG. 8. This completed assembly, shown hidden, may be mounted on still a larger PCB or other substrate (not shown), one example being a "motherboard" of much larger size, should such a board be required. These components are shown hidden because these are enclosed within and thus behind a suitable housing 105 designed to accommodate the various electrical and other components which form part of system 101. PCB 85 may instead comprise such a "motherboard" in system 101 and thus include additional electrical assemblies, including additional printed circuit "cards" mounted thereon, such additional "cards" in turn also possibly including additional electronic components as part thereof. It is thus seen and understood that the electrical assemblies made in accordance with the unique teachings herein may be utilized in several various structures as part of a much larger system, such as information handling system 101. Further description is not believed necessary.

While there have been shown and described what are at present considered to be the preferred embodiments of the invention, it will be obvious to those skilled in the art that various changes and modifications may be made therein without departing from the scope of the invention as defined by the appended claims.

What is claimed is:

1. A circuitized substrate comprising:
    a first layer comprised of a dielectric material including a low moisture absorptive polymer resin material and a nodular fluoropolymer web encased within said low moisture absorptive polymer resin material, said first layer not including continuous or semi-continuous fibers as part thereof; and
    at least one circuitized layer positioned on said first layer.

2. The circuitized substrate of claim 1 wherein said first layer includes a plurality of thru-holes therein, the aspect ratio of the thickness of said circuitized substrate to the diameter of each of said thru-holes being within the range of from about 2:1 to about 20:1.

3. The circuitized substrate of claim 1 wherein said low moisture absorptive polymer resin comprises a high Tg thermosetting polymer.

4. The circuitized substrate of claim 1 wherein said dielectric material has less than 0.15% moisture absorption when immersed in water for a period of about 24 hours at a temperature of about 22° C.

5. The circuitized substrate of claim 1 wherein said at least one circuitized layer is comprised of copper.

6. The circuitized substrate of claim 1 further including a second circuitized layer positioned on said first layer on a side opposite said at least one circuitized layer.

7. The circuitized substrate of claim 6 further including a plurality of conductive thru-holes in said first layer, selected ones of said conductive thru holes electrically coupling selected parts of said at least one circuitized layer to selected parts of said second circuitized layer.

8. The invention of claim 7 wherein said circuitized substrate comprises a chip carrier.

9. The circuitized substrate of claim 6 further including second and third dielectric layers positioned on said at least one circuitized layer and said second circuitized layer, respectively, and third and fourth circuitized layers formed on said second and third dielectric layer, respectively.

10. The circuitized substrate of claim 1 wherein said nodular fluoropolymer web comprises from about 10 to about 80 percent by volume of said first layer of dielectric material layer.

11. An electrical assembly comprising:
    a circuitized substrate including a first layer comprised of a dielectric material including a low moisture absorptive polymer resin material and a nodular fluoropolymer web encased within said low moisture absorptive polymer resin material, said first layer not including continuous or semi-continuous fibers as part thereof;
    at least one circuitized layer positioned on said first layer; and
    at least one electrical component positioned on and electrically coupled to said circuitized substrate.

12. The electrical assembly of claim 11 wherein said first layer of said circuitized substrate includes a plurality of thru-holes therein, the aspect ratio of thickness of said circuitized substrate to the diameter of each of said thru-holes being within the range of from about 2:1 to about 20:1.

13. The electrical assembly of claim 11 wherein said low moisture absorptive polymer resin comprises a high Tg thermosetting polymer.

14. The electrical assembly of claim 13 wherein said dielectric material has less than 0.15% moisture absorption when immersed in water for a period of about 24 hours at a temperature of about 22° C.

15. The electrical assembly of claim 14 wherein said at least one circuitized layer is comprised of copper.

16. The electrical assembly of claim 11 further including a second circuitized layer positioned on said first layer on a side opposite said at least one circuitized layer.

17. The electrical assembly of claim 16 further including a plurality of conductive thru-holes in said first layer, selected ones of said conductive thru-holes electrically coupling selected parts of said at least one circuitized layer to selected parts of said second circuitized layer.

18. The electrical assembly of claim 16 further including second and third dielectric layers positioned on said at least one circuitized layer and said second circuitized layer, respectively, and third and fourth circuitized layers formed on said second and third dielectric layer, respectively.

19. The electrical assembly of claim 11 wherein said circuitized substrate comprises a chip carrier and said at least one electrical component comprises a semiconductor chip.

20. The electrical assembly of claim 11 wherein said nodular fluoropolymer web comprises from about 10 to about 80 percent by volume of said first layer of dielectric material.

21. A method of making a circuitized substrate, said method comprising:
   providing a first layer comprised of a dielectric material including a low moisture absorptive polymer resin and a nodular fluoropolymer web encased within said low moisture absorptive polymer resin, said first layer not including continuous or semi-continuous fibers as part thereof; and
   positioning at least one circuitized layer on said first layer of said dielectric material.

22. The method of claim 21 further providing in said first layer a plurality of thru-holes, the aspect ratio of the thickness of said circuitized substrate to the diameter of each of said thru-holes being within the range of from about 2:1 to about 20:1.

23. The method of claim 22 wherein said plurality of thru-holes are provided within said first layer using a laser.

24. The method of claim 21 further including positioning a second circuitized layer on said first layer on a side opposite said at least one circuitized layer.

25. The method of claim 24 further including providing a plurality of conductive thru-holes in said first layer such that selected ones of said conductive thru holes electrically couple selected parts of said at least one circuitized layer to selected parts of said second circuitized layer.

26. The method of claim 21 further including electrically coupling at least one electrical component to said at least one circuitized layer on said first layer of said dielectric material.

27. A multilayered circuitized structure comprising:
   a first circuitized substrate portion including a first layer having a first pattern of conductive thru-holes therein and comprised of a dielectric material including a low moisture absorptive polymer resin material and a nodular fluoropolymer web encased within said low moisture absorptive polymer resin material, said first layer not including continuous or semi-continuous fibers as part thereof; and
   second and third circuitized substrate portions positioned on opposite sides of said first circuitized substrate portion, each having a second pattern of interconnecting thru-holes therein, said first circuitized substrate portion providing electrical interconnection between said second and third circuitized substrate portions, including interconnecting selected ones of said thru-holes in said second circuitized substrate portion with corresponding thru-holes within said third circuitized substrate portion.

28. The invention of claim 27 wherein said multilayered circuitized structure comprises a printed circuit board.

29. The invention of claim 27 wherein said multilayered circuitized structure comprises a chip carrier.

30. The multilayered circuitized structure of claim 29 further including at least one semiconductor chip positioned on or within said chip carrier and forming part thereof.

31. An information handling system comprising:
   a housing;
   a circuitized substrate positioned within said housing and including a first layer comprised of a dielectric material including a low moisture absorptive polymer resin material and a nodular fluoropolymer web encased within said low moisture absorptive polymer resin material, said first layer not including continuous fibers as part thereof;
   at least one circuitized layer positioned on said first layer; and
   at least one electrical component positioned on and electrically coupled to said circuitized substrate.

32. The invention of claim 31 wherein said information handling system comprises a personal computer.

33. The invention of claim 31 wherein said information handling system comprises a mainframe computer.

34. The invention of claim 31 wherein said information handling system comprises a computer server.

* * * * *